(12) United States Patent
Saito (10) Patent No.: US 9,582,747 B2
(45) Date of Patent: Feb. 28, 2017

(54) RADIO COMMUNICATION TAG AND METHOD FOR MANUFACTURING THE SAME

(71) Applicant: Murata Manufacturing Co., Ltd., Nagaokakyo-shi, Kyoto-fu (JP)

(72) Inventor: Yoichi Saito, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/686,894

(22) Filed: Apr. 15, 2015

(65) Prior Publication Data

US 2015/0302290 A1    Oct. 22, 2015

(30) Foreign Application Priority Data

Apr. 22, 2014  (JP) ................................ 2014-087900

(51) Int. Cl.
*G06K 19/077* (2006.01)
*H01L 23/66* (2006.01)
(Continued)

(52) U.S. Cl.
CPC . *G06K 19/07752* (2013.01); *G06K 19/07722* (2013.01); *G06K 19/07786* (2013.01); *H01L 21/52* (2013.01); *H01L 23/66* (2013.01); *H01L 23/145* (2013.01); *H01L 23/3128* (2013.01); *H01L 23/4985* (2013.01); *H01L 24/16* (2013.01); *H01L 2223/6677* (2013.01); *H01L 2224/16225* (2013.01); *H01L 2924/1421* (2013.01); *H01L 2924/1579* (2013.01); *H01L 2924/15311* (2013.01); *H01L 2924/15787* (2013.01)

(58) Field of Classification Search
CPC ................ H01L 23/4985; H01L 21/52; H01L 2223/6677; H01L 23/145; G06K 19/07749; G06K 19/0723; G06K 19/07786; G06K 19/07752; G06K 19/07722; H05K 2201/2009; G05K 19/07786
USPC ................................ 235/488, 492
See application file for complete search history.

(56) References Cited

U.S. PATENT DOCUMENTS 7,224,278 B2 * 5/2007 Phaneuf ................ B31D 1/025
                                                   340/572.1
7,982,295 B2 * 7/2011 Kobayashi ....... G06K 19/07728
                                                      257/678

(Continued)

FOREIGN PATENT DOCUMENTS

JP       2012-018629 A        1/2012
KR   WO 2013094812 A1 *   6/2013    ....... G06K 19/07783

*Primary Examiner* — Claude J Brown
(74) *Attorney, Agent, or Firm* — Keating & Bennett, LLP (57) ABSTRACT

An antenna conductor and a reinforcing layer are provided on an upper surface and a lower surface, respectively, of a flexible base film. An RFIC element is mounted on the upper surface of the base film. Two I/O terminals provided on the RFIC element are each connected to meander patterns of the antenna conductor. In a plan view, the reinforcing layer has a circular contour, and the RFIC element is surrounded by the contour of the reinforcing layer. The two I/O terminals provided on the RFIC element are exposed on the upper surface of the base film. Breakage of the connected portion between the RFIC element and the antenna conductor is prevented, and any breakage that has occurred is easily identified.

20 Claims, 7 Drawing Sheets (51) Int. Cl.
  *H01L 21/52* (2006.01)
  *H01L 23/498* (2006.01)
  *H01L 23/31* (2006.01)
  *H01L 23/00* (2006.01)
  *H01L 23/14* (2006.01)

(56) References Cited

U.S. PATENT DOCUMENTS

| | | | | |
|---|---|---|---|---|
| 2005/0128086 | A1* | 6/2005 | Brown | G06K 19/07728 340/572.8 |
| 2006/0273180 | A1* | 12/2006 | Ammond | G06K 19/07749 235/492 |
| 2008/0173997 | A1* | 7/2008 | Kobayashi | G06K 19/0723 257/679 |
| 2008/0272885 | A1* | 11/2008 | Atherton | G06K 19/07749 340/10.1 |
| 2010/0001387 | A1* | 1/2010 | Kobayashi | G06K 19/077 257/679 |
| 2010/0078487 | A1* | 4/2010 | Baba | G06K 19/07718 235/492 |
| 2010/0108770 | A1* | 5/2010 | Kai | G06K 19/07728 235/488 |
| 2011/0079651 | A1* | 4/2011 | Tsai | B32B 27/00 235/492 |
| 2011/0146878 | A1* | 6/2011 | Sasaki | B32B 37/142 156/60 |
| 2011/0220727 | A1* | 9/2011 | Lee | H01Q 1/2208 235/492 |
| 2012/0241521 | A1* | 9/2012 | Kim | H01Q 1/2225 235/492 |
| 2013/0050047 | A1* | 2/2013 | Carr | H01Q 1/248 343/853 |
| 2013/0277433 | A1* | 10/2013 | Baba | G06K 19/07749 235/488 |
| 2013/0293356 | A1* | 11/2013 | Mukai | G06K 7/10366 340/10.1 |
| 2014/0209690 | A1* | 7/2014 | Teng | G06K 19/027 235/492 |
| 2016/0148086 | A1* | 5/2016 | Clarke | G06K 19/07749 235/492 |

* cited by examiner

FIG.4A FORMING ANTENNA CONDUCTOR

FIG.4B FORMING REINFORCING LAYER

FIG.4C MOUNTING RFIC ELEMENT

RADIO COMMUNICATION TAG AND METHOD FOR MANUFACTURING THE SAME

BACKGROUND OF THE INVENTION

1. Field of the Invention

The present invention relates to radio communication tags, and to a radio communication tag including a base sheet on which an antenna conductor is provided and an RFIC element mounted on the base sheet, the RFIC element including a connection terminal connected to the antenna conductor. The present invention also relates to a method for manufacturing such a radio communication tag.

2. Description of the Related Art

For management of linen products such as uniforms, sheets, and the like, RFID tags (radio communication tags) are attached to some of such linen products. For this purpose, Japanese Patent Laying-Open No. 2012-18629, for example, discloses a technique in which an RFIC chip is covered with resin. This technique allows the RFIC chip to be protected against stress and a solvent during cleaning.

With the technique described in Japanese Patent Laying-Open No. 2012-18629, however, because the covered portion has a great height, a user tends to feel discomfort when he or she touches the RFID tag with fingers. There is also a possibility that the covered portion may swell during cleaning depending on the type of the solvent, which causes a connected portion between the RFIC chip and the antenna to break.

SUMMARY OF THE INVENTION

Accordingly, preferred embodiments of the present invention provide a radio communication tag and a method for manufacturing the radio communication tag in which the condition of the connected portion is easily checked, and breakage of the connected portion is prevented.

A radio communication tag according to a preferred embodiment of the present invention includes a base sheet having flexibility, an antenna conductor provided on the base sheet, a reinforcing layer provided on a first main surface of the base sheet, and an RFIC element mounted on a second main surface of the base sheet, the RFIC element including a connection terminal connected to the antenna conductor. The reinforcing layer preferably has a circular contour in a plan view. The RFIC element is surrounded by the contour of the reinforcing layer in a plan view. The connection terminal is exposed on the second main surface of the base sheet.

Preferably, the RFIC element has a communication frequency in an UHF band, and the antenna conductor is a dipole antenna conductor.

Preferably, the antenna conductor includes a meander pattern that meanders in a direction away from the RFIC element, and a folded pattern connected with the meander pattern and extending toward the RFIC element.

Preferably, the antenna conductor includes a loop pattern surrounding the RFIC element in a plan view.

Preferably, the reinforcing layer has a flat shape.

Preferably, the RFIC element includes an RFIC chip, a substrate on which the RFIC chip is mounted, and a sealing layer that seals the RFIC chip.

Preferably, the radio communication tag is attached to a linen product, for example.

A method for manufacturing a radio communication tag according to another preferred embodiment of the present invention includes a first step of forming an antenna conductor on a base sheet having flexibility; a second step of forming, after the first step, a reinforcing layer on a first main surface of the base sheet; and a third step of mounting, after the second step, an RFIC element on a second main surface of the base sheet, the RFIC element including a connection terminal connected to the antenna conductor. In the second step, the reinforcing layer is formed to have a circular contour in a plan view. In the third step, the RFIC element is mounted such that the RFIC element is surrounded by the contour of the reinforcing layer in a plan view, and the connection terminal is exposed on the second main surface of the base sheet.

Since the RFIC element is surrounded by the contour of the reinforcing layer in a plan view, stress concentration on a connected portion between the RFIC element and the antenna conductor is alleviated. This prevents breakage of the connected portion. Moreover, since the reinforcing layer has a circular contour in a plan view, when an external force along the first main surface of the base film is applied to the reinforcing layer, a stress on the reinforcing layer against this external force is distributed.

This makes removal of the reinforcing layer unlikely. Furthermore, since the reinforcing layer is provided on the first main surface of the base film, and the connection terminal of the RFIC element is exposed on the second main surface of the base film, breakage of the connected portion is easily identified.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Radio communication tags according to preferred embodiments of the invention preferably are RFID (Radio Frequency IDentification) tags with communication frequencies in the UHF band, and are attachable to linen products that need to be cleaned, such as uniforms, sheets, and the like, for example.

With reference to FIGS. 1A to 1C, FIG. 2 and FIG. 3, an RFID tag 10 according to a preferred embodiment of the present invention includes an RFIC (Radio Frequency Integration Circuit) element 12 preferably with a rectangular or substantially rectangular parallelepiped shape and a band-shaped base film 14. An antenna conductor 16 and a reinforcing layer 18 are provided on an upper surface and a lower surface, respectively, of the base film 14. The RFIC element 12 is mounted on a central portion of the upper surface of the base film 14 such that the antenna conductor 16 defines and serves as a dipole antenna.

Figure 1A:
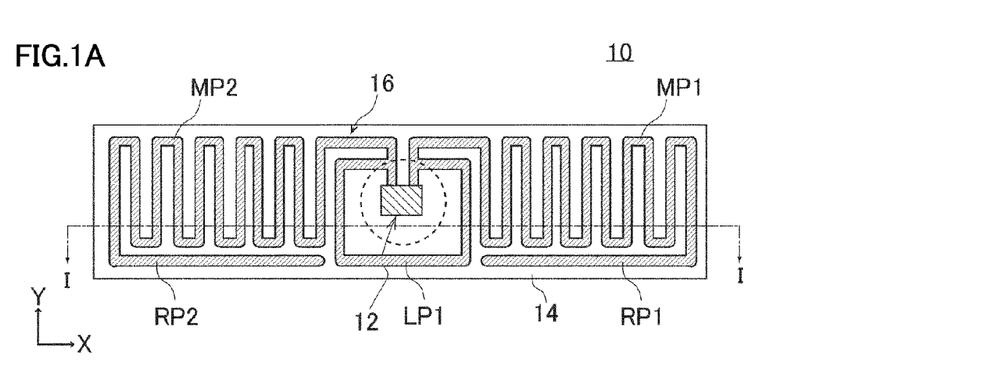
FIG. 1A is a top view showing an example of a state of an RFID tag according to a preferred embodiment of the present invention as seen from above.
Figure 1B:
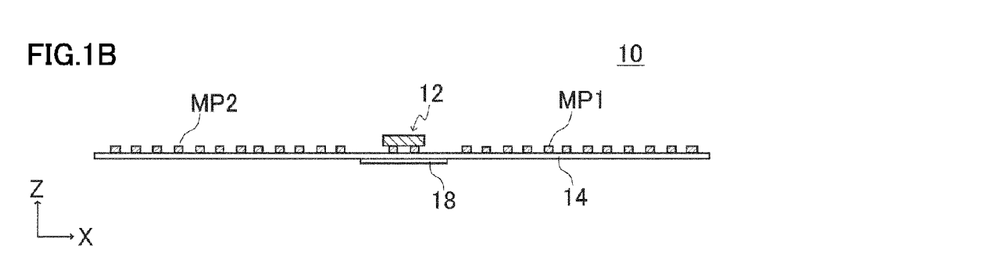
FIG. 1B is a cross-sectional view showing a cross section along line I-I of the RFID tag according to the preferred embodiment shown in FIG. 1A.
Figure 1C:
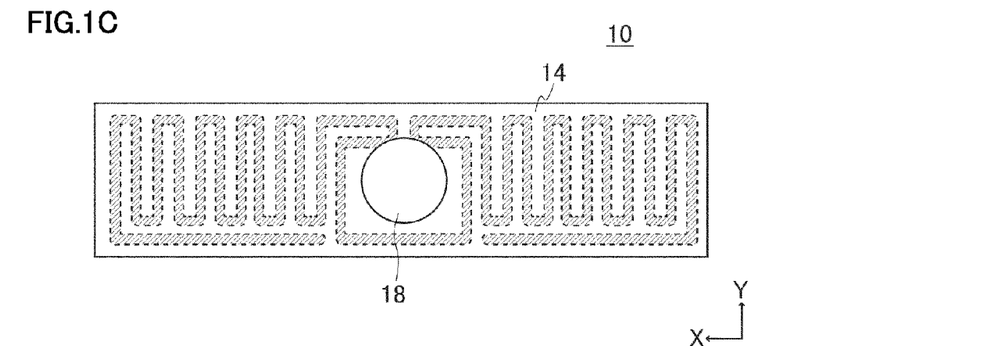
FIG. 1C is a bottom view showing an example of a state of the RFID tag according to the preferred embodiment shown in FIG. 1A as seen from the bottom.

It is noted that the base film 14 is preferably made of a resin material such as polyimide or the like, and has heat resistance and flexibility. The antenna conductor 16 is preferably made of a metal material such as Cu or the like, and has heat resistance and flexibility. Furthermore, preferably, a reinforcing layer 18 has an elastic modulus higher (in particular, a Young's modulus lower) than that of the base film, and has high adhesion with the base film (that is, if resin is used as the base film, resin is also used as the reinforcing layer). For example, the reinforcing layer 18 is preferably made of a resin material such as silicone or the like, and has heat resistance.

In this preferred embodiment, a length direction, a width direction, and a thickness direction are defined as an X-axis, a Y-axis, and a Z-axis, respectively, of the base film 14. Hereinafter, a surface toward the positive direction of the Z-axis will be referred to as an "upper surface", a surface toward the negative direction of the Z-axis referred to as a "lower surface", and a surface toward a direction orthogonal to the Z-axis referred to as a "side surface".

Figure 2:
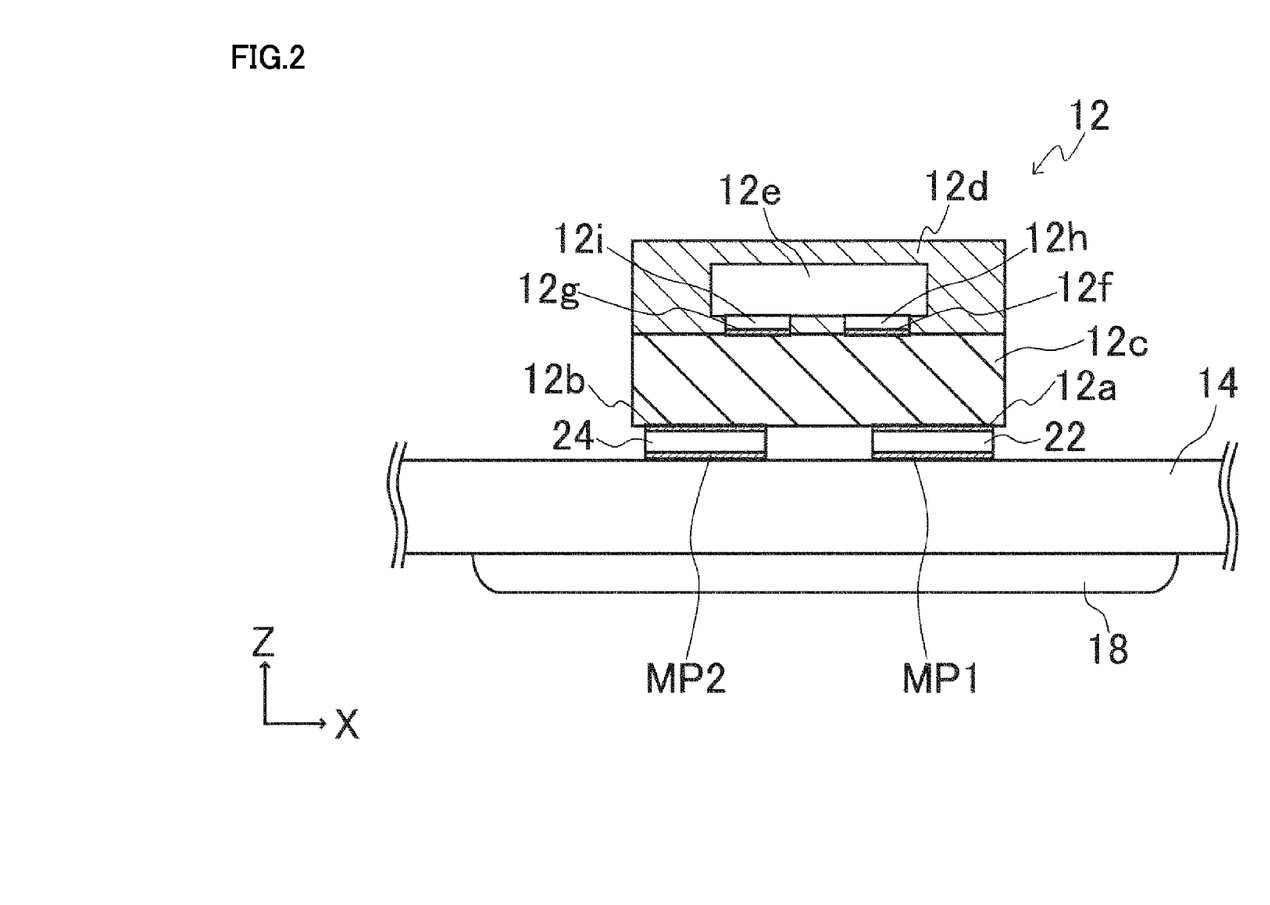
FIG. 2 is a schematic diagram showing an exemplary structure of an RFIC element applied to the RFID tag shown in FIG. 1.

As seen from FIG. 2, the RFIC element 12 is configured to include an RFIC chip 12e that processes an RFID signal and a feed circuit substrate 12c on which RFIC chip 12e is mounted. Two I/O terminals 12a and 12b, which are aligned along the X-axis, are provided on a lower surface of the RFIC element 12. I/O terminals 12a and 12b are connected to I/O terminals 12h and 12i, respectively, of the RFIC chip 12e, via a feed circuit 12fct (see FIG. 3) provided on the feed circuit substrate 12c.

The antenna conductor 16 includes a meander pattern MP1 that meanders toward the positive direction of the X-axis from a rear end thereof corresponding to a position slightly toward the positive direction of the X-axis relative to the center of the upper surface. The antenna conductor 16 also includes a meander pattern MP2 that meanders toward the negative direction of the X-axis from a rear end thereof corresponding to a position slightly toward the negative direction of the X-axis relative to the center of the upper surface. A forward end of the meander pattern MP1 reaches a position near a positive-side end in the X-axis direction and near a negative-side end in the Y-axis direction. A forward end of the meander pattern MP2 reaches a position near a negative-side end in the X-axis direction and near a negative-side end in the Y-axis direction.

Furthermore, the antenna conductor 16 includes a folded pattern RP1 that extends on the negative side in the Y-axis direction from a rear end thereof corresponding to the position of the forward end of the meander pattern MP1. The antenna conductor 16 also includes a folded pattern RP2 that extends on the positive side in the Y-axis direction from a rear end thereof corresponding to the position of the forward end of meander pattern MP2. The forward end of each of the folded patterns RP1 and RP2 is an open end.

The reinforcing layer 18 preferably has a flat shape in a central portion on the lower surface of the base film 14. In a plan view, the reinforcing layer 18 preferably has a contour in the form of a perfect circle. As described above, the RFIC element 12 is mounted on a central portion of the upper surface of the base film 14. The perfect circle defining the contour of the reinforcing layer 18 is greater in diameter than a width and a length of RFIC element 12. Thus, in a plan view, the RFIC element 12 is surrounded by the contour of the reinforcing layer 18.

As seen from FIG. 2, the I/O terminals 12a and 12b of the RFIC element 12 are connected to the rear end of the meander pattern MP1 and the rear end of the meander pattern MP2, respectively. The I/O terminal 12a and the meander pattern MP1 are connected with a conductive joint member 22, and the I/O terminal 12b and the meander pattern MP2 are connected with a conductive joint member 24. It is noted that the joint members 22 and 24 are each preferably made of a material such as Ag or solder.

The antenna conductor 16 also includes a loop pattern LP1 that extends in the form of a loop to connect a position near the rear end of the meander pattern MP1 and a position near the rear end of the meander pattern MP2. In a plan view, the RFIC element 12 is surrounded by loop pattern LP1.

With reference to FIG. 2, the feed circuit substrate 12c of the RFIC element 12 preferably has a plate shape and preferably is made of a material such as a ceramic or resin. The RFIC chip 12e mounted on an upper surface of feed circuit substrate 12c is sealed with sealing layer 12d preferably made of resin. Side surfaces of the feed circuit substrate 12c are perpendicular or substantially perpendicular to each of the X-axis and the Y-axis, and side surfaces of sealing layer 12d are flush or substantially flush with the side surfaces of the feed circuit substrate 12c.

The I/O terminals 12a and 12b described above are provided on a lower surface of the feed circuit substrate 12c. The I/O terminals 12f and 12g are provided on an upper surface of the feed circuit substrate 12c. The I/O terminals 12h and 12i are provided on a lower surface of the RFIC chip 12e. The I/O terminals 12h and 12i are connected to the I/O terminals 12f and 12g, respectively, with conductive joint members (not shown).

Figure 3:
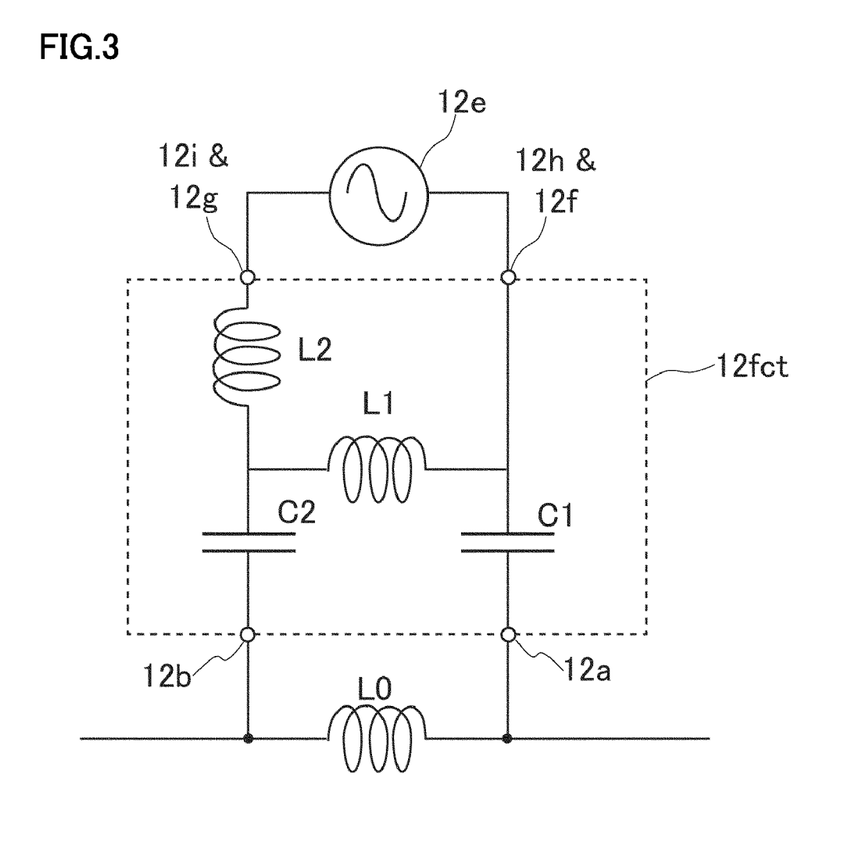
FIG. 3 is a circuit diagram showing an equivalent circuit of the RFID tag according to a preferred embodiment of the present invention.

FIG. 3 shows an equivalent circuit of the RFID tag 10. The feed circuit 12fct is provided on the feed circuit substrate 12c. One end of a capacitor C1 is connected to the I/O terminal 12a, and the other end of the capacitor C1 is connected to the I/O terminal 12f and thus, to the I/O terminal 12h. One end of a capacitor C2 is connected to the I/O terminal 12b, and the other end of the capacitor C2 is connected to one end of an inductor L2. The other end of the inductor L2 is connected to the I/O terminal 12g and thus, to the I/O terminal 12i. One end of an inductor L1 is connected to the other end of the capacitor C1, and the other end of the inductor L1 is connected to the other end of the capacitor C2.

It is noted that an inductor L0 is an inductor component of the loop pattern LP1, and is magnetically coupled to the inductors L1 and L2. This enables matching over a wide band.

Figure 4A:
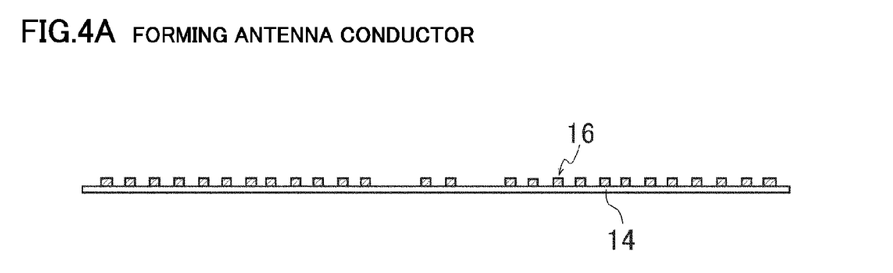
FIG. 4A is a schematic diagram showing the step of forming an antenna conductor on a base film.
Figure 4B:
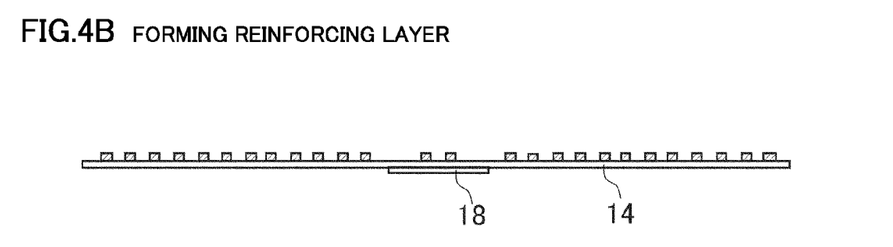
FIG. 4B is a schematic diagram showing the step of forming a reinforcing layer on the base film.
Figure 4C:
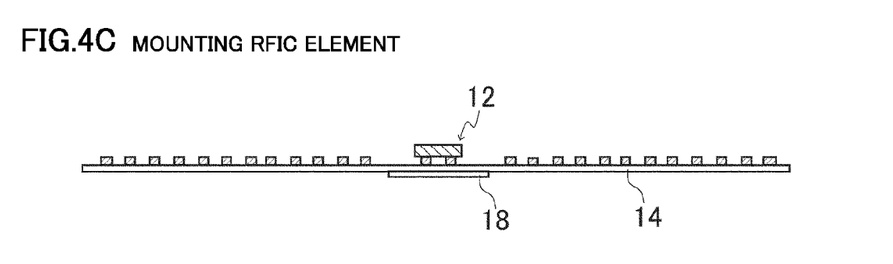
FIG. 4C is a schematic diagram showing the step of mounting an RFIC element on the base film.

Next, with reference to FIGS. 4A to 4C, a method for manufacturing the RFIC element 12 will be described. First, the antenna conductor 16 including the loop pattern LP1, the meander patterns MP1, MP2, and the folded patterns RP1, RP2 are formed on the upper surface of the base film 14. Specifically, metal foil such as Cu foil or the like is attached to the upper surface of base film 14, and the metal foil is patterned preferably using a thin-film process.

Next, a central portion of the lower surface of the base film 14 is potted with a silicone-based resin having heat resistance, and then a flat plate jig is pressed against the resin. The reinforcing layer 18 with a flat shape is thus formed. The reinforcing layer 18 formed preferably has a contour in the form of a perfect circle in a plan view. The contour of the reinforcing layer 18 is greater in diameter than a width and a length of the RFIC element 12.

After the reinforcing layer 18 has been formed, the RFIC element 12 is mounted on a central portion of the upper surface of the base film 14 preferably by a reflow method. Specifically, the joint members 22 and 24 are printed on the I/O terminals 12a and 12b, The RFIC element 12 is placed on the central portion of the upper surface of the base film 14 such that the I/O terminals 12a and 12b are connected to the meander patterns MP1 and MP2, and then the base film 14 including the RFIC element 12 mounted thereon is heated in a reflow furnace. The RFID tag 10 is thus completed.

It is noted that when the RFIC element 12 is placed on the central portion of the upper surface of the base film 14, the reinforcing layer 18 formed on the central portion of the lower surface of the base film 14 serves as a cushion material.

As is clear from the foregoing description, the antenna conductor 16 and the reinforcing layer 18 are formed on the upper surface and the lower surface, respectively, of the base film 14 having flexibility. The RFIC element 12 is mounted on the upper surface of the base film 14. Here, the I/O terminals 12a and 12b of the RFIC element 12 are connected to the meander patterns MP1 and MP2, respectively, that define the antenna conductor 16. In a plan view, the reinforcing layer 18 preferably has a circular contour, and the RFIC element 12 is surrounded by the contour of the reinforcing layer 18. The I/O terminals 12a and 12b of the RFIC element 12 are exposed on the upper surface of the base film 14.

Since the RFIC element 12 is surrounded by the contour of the reinforcing layer 18 in a plan view, stress concentration on a connected portion between the RFIC element 12 and the antenna conductor 16 (stress concentration that occurs during cleaning) is alleviated. This prevents breakage of the connected portion. Moreover, since the reinforcing layer 18 preferably has a circular contour in a plan view, when an external force along the lower surface of the base film 14 is applied to the reinforcing layer 18, a stress on the reinforcing layer 18 against this external force is distributed. This makes removal of the reinforcing layer 18 unlikely. Furthermore, since the reinforcing layer 18 is provided on the lower surface of the base film 14, and the I/O terminals 12a and 12b of RFIC element 12 are exposed on the upper surface of the base film 14, breakage of the connected portion is easily identified.

Furthermore, since the reinforcing layer 18 preferably has a flat shape, in particular, with a height (thickness) smaller than that of the RFIC element, a user is unlikely to feel discomfort when he or she touches the reinforcing layer 18 with fingers, and moreover, the reinforcing layer 18 is unlikely to be peeled from the base film. Furthermore, since the folded patterns RP1 and RP2 are formed on a portion of the antenna conductor 16, the meander pattern MP1 or MP2 is not readily disconnected even if an external force is applied that twists the base film 14 in a direction around the X-axis. Moreover, since the loop pattern LP1 surrounds the RFIC element 12 in a plan view, stress concentration on the connected portion between the RFIC element 12 and the antenna conductor 16 is alleviated.

It is noted that the feed circuit substrate 12c is preferably made of a material such as a ceramic or resin, and the RFIC chip 12e is sealed with the sealing layer 12d. This makes the RFIC element 12 small yet robust, with sufficient resistance against a stress that may occur during cleaning or the like.

Figure 5A:
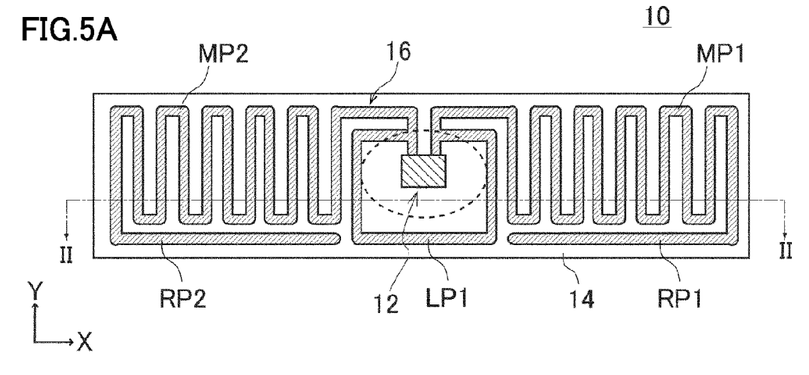
FIG. 5A is a top view showing an example of a state of an RFID tag according to another preferred embodiment of the present invention as seen from above.
Figure 5B:
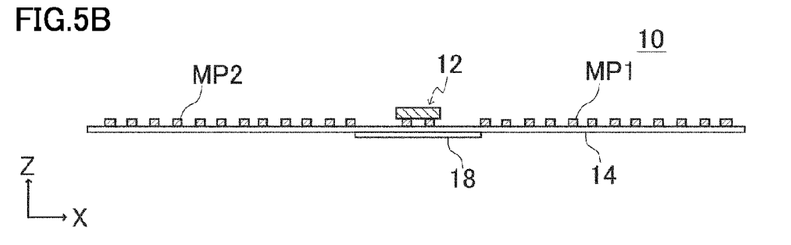
FIG. 5B is a cross-sectional view showing a cross section along line II-II of the RFID tag according to the preferred embodiment shown in FIG. 5A.
Figure 5C:
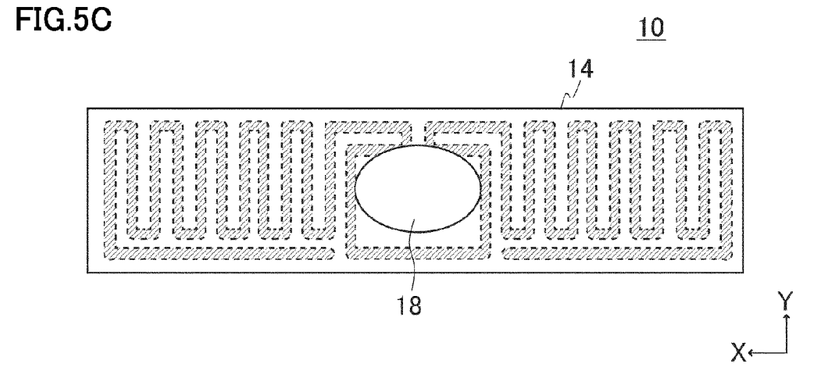
FIG. 5C is a bottom view showing an example of a state of the RFID tag according to the preferred embodiment shown in FIG. 5A as seen from the bottom.

It is noted that in this preferred embodiment, the contour of reinforcing layer 18 in a plan view preferably has a perfect circle shape, for example. However, the contour of the reinforcing layer 18 in a plan view may also be an oval shape. In this case, preferably, the long axis of the oval extends along the X-axis, as shown in FIGS. 5A to 5C. Other shapes of the contour of the reinforcing layer 18 are also possible.

Figure 6:
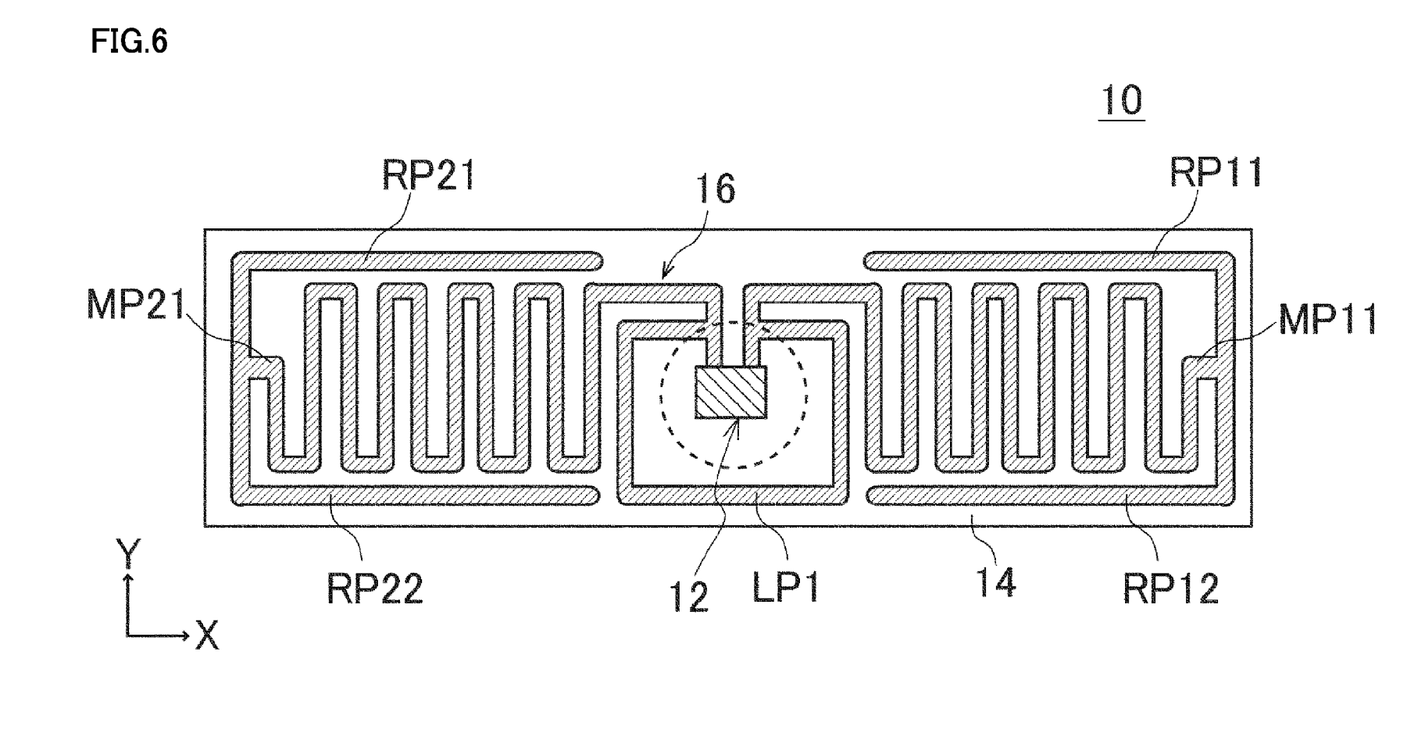
FIG. 6 is a top view showing an example of a state of an RFID tag according to a still another preferred embodiment of the present invention as seen from above.

Furthermore, in this preferred embodiment, the single folded pattern RP1 is connected with the meander pattern MP1, and the single folded pattern RP2 is connected with the meander pattern MP2. As shown in FIG. 6, however, the two folded patterns RP11 and RP12 may be configured such that the meander pattern MP11 is sandwiched therebetween in the Y-axis direction, and the two folded patterns RP21 and RP22 may be formed such that the meander pattern MP21 is sandwiched therebetween in the Y-axis direction. This further improves the resistance against an external force that twists the base film 14 in the direction around the X-axis.

Figure 7:
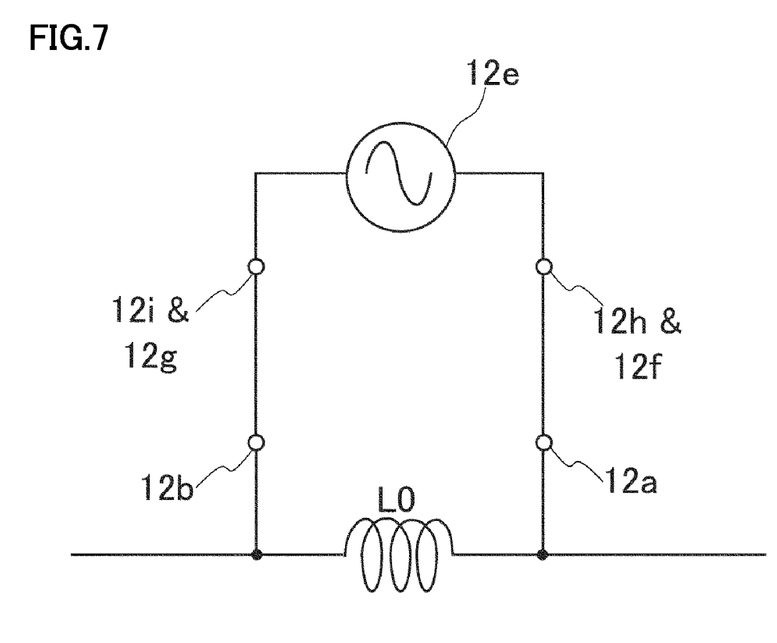
FIG. 7 is a circuit diagram showing an equivalent circuit of the RFID tag according to a yet another preferred embodiment of the present invention.

Furthermore, although the feed circuit 12fct shown in FIG. 3 is provided on the feed circuit substrate 12c in this preferred embodiment, feed circuit fct may not be provided. In this case, impedance matching between the RFIC chip and the antenna conductor may be provided by the loop pattern on the antenna conductor. In this case, the equivalent circuit is configured as shown in FIG. 7.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A radio communication tag comprising:
a flexible base sheet;
an antenna conductor provided on the base sheet;
a reinforcing layer provided on a first main surface of the base sheet; and
an RFIC element mounted on a second main surface of the base sheet, the RFIC element including a connection terminal connected to the antenna conductor; wherein
the RFIC element is surrounded by a contour of the reinforcing layer in a plan view,
the connection terminal is exposed on the second main surface of the base sheet,
the antenna conductor includes a loop pattern surrounding the RFIC element in the plan view, and the contour of the reinforcing layer is surrounded by the loop pattern in the plan view.

2. The radio communication tag according to claim 1, wherein the RFIC element has a communication frequency in an UHF band, and the antenna conductor defines a dipole antenna.

3. The radio communication tag according to claim 1, wherein the antenna conductor includes a meander pattern that meanders in a direction away from the RFIC element, and a folded pattern connected with the meander pattern and extending toward the RFIC element.

4. The radio communication tag according to claim 1, wherein the reinforcing layer has a flat shape.

5. The radio communication tag according to claim 1, wherein the RFIC element includes an RFIC chip, a substrate on which the RFIC chip is mounted, and a sealing layer that seals the RFIC chip.

6. The radio communication tag according to claim 1, wherein the radio communication tag is configured to be attached to a linen product.

7. The radio communication tag according to claim 1, wherein the contour of the reinforcing layer is a perfect circle in a plan view.

8. The radio communication tag according to claim 7, wherein a diameter of the contour of the reinforcing layer is greater than a width and a length of the RFIC element.

9. The radio communication tag according to claim 1, wherein the contour of the reinforcing layer is oval in a plan view.

10. The radio communication tag according to claim 1, further comprising a feed circuit substrate including a feed circuit, wherein the RFIC element is mounted on the feed circuit substrate.

11. The radio communication tag according to claim 1, further comprising input/output terminals, capacitors and an inductor connected to each other.

12. The radio communication tag according to claim 1, wherein the RFIC element is mounted on central portion of the second main surface of the base sheet.

13. The radio communication tag according to claim 1, wherein the reinforcing layer has a height less than a height of the RFIC element.

14. The radio communication tag according to claim 1, wherein the antenna conductor includes a meander pattern and two folded patterns sandwiching the meander pattern.

15. A method for manufacturing a radio communication tag comprising the steps of:
a first step of forming an antenna conductor on a flexible base sheet;
a second step of forming, after the first step, a reinforcing layer on a first main surface of the base sheet; and
a third step of mounting, after the second step, an RFIC element on a second main surface of the base sheet, the RFIC element including a connection terminal connected to the antenna conductor; wherein
the third step includes mounting the RFIC element such that the RFIC element is surrounded by a contour of the reinforcing layer in a plan view, and the connection terminal is exposed on the second main surface of the base sheet,
the antenna conductor includes a loop pattern surrounding the RFIC element in the plan view, and
the contour of the reinforcing layer is surrounded by the loop pattern in the plan view.

16. The method according to claim 15, wherein the contour of the reinforcing layer is a perfect circle in a plan view.

17. The method according to claim 16, wherein a diameter of the contour of the reinforcing layer is greater than a width and a length of the RFIC element.

18. The method according to claim 15, wherein the contour of the reinforcing layer is oval in a plan view.

19. A radio communication tag comprising:
a flexible base sheet;
an antenna conductor provided on the base sheet;
a reinforcing layer provided on a first main surface of the base sheet; and
an RFIC element mounted on a second main surface of the base sheet, the RFIC element including a connection terminal connected to the antenna conductor; wherein
the RFIC element is surrounded by a contour of the reinforcing layer in a plan view,
the connection terminal is exposed on the second main surface of the base sheet,
the antenna conductor includes a loop pattern surrounding the RFIC element in the plan view, and
a maximum diameter of the contour of the reinforcing layer is smaller than a width and a length of the loop pattern.

20. A method for manufacturing a radio communication tag comprising the steps of:
a first step of forming an antenna conductor on a flexible base sheet;
a second step of forming, after the first step, a reinforcing layer on a first main surface of the base sheet; and
a third step of mounting, after the second step, an RFIC element on a second main surface of the base sheet, the RFIC element including a connection terminal connected to the antenna conductor; wherein
the third step includes mounting the RFIC element such that the RFIC element is surrounded by a contour of the reinforcing layer in a plan view, and the connection terminal is exposed on the second main surface of the base sheet,
the antenna conductor includes a loop pattern surrounding the RFIC element in the plan view, and
a maximum diameter of the contour of the reinforcing layer is smaller than a width and a length of the loop pattern.

* * * * *